(12) United States Patent
Murillo et al.

(10) Patent No.: US 7,504,864 B2
(45) Date of Patent: Mar. 17, 2009

(54) METHOD FOR CONTROLLING THE EVALUATION TIME OF A STATE MACHINE

(75) Inventors: Laurent Murillo, Marseilles (FR); François Tailliet, Fuveau (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/821,094

(22) Filed: Jun. 19, 2007

(65) Prior Publication Data

US 2008/0012597 A1    Jan. 17, 2008

(30) Foreign Application Priority Data

Jun. 28, 2006    (FR) .................................. 06 05814

(51) Int. Cl.
*H03K 19/096* (2006.01)

(52) U.S. Cl. .......................................... 326/96; 326/46

(58) Field of Classification Search ............. 326/37–49, 326/93–98

See application file for complete search history.

(56) References Cited

U.S. PATENT DOCUMENTS 5,559,449 A  *  9/1996  Padoan et al. ................. 326/40
5,870,441 A  *  2/1999  Cotton et al. ................ 375/354

FOREIGN PATENT DOCUMENTS

EP          0 297 918 A2    1/1989
EP          0 440 357 A2    8/1991
WO          WO 2005/114884 A1    12/2005

\* cited by examiner

*Primary Examiner*—Rexford Barnie
*Assistant Examiner*—Jany Tran
(74) *Attorney, Agent, or Firm*—Lisa K. Jorgenson; Timothy L. Boller; Seed IP Law Group PLLC

(57) ABSTRACT

A method for protecting a state machine having an operation modeled by a set of states linked to each other by transitions, the state machine evaluating output signals upon each transition during an evaluation phase according to input signals comprising signals evaluated during a previous transition, the method comprising steps of determining a minimum duration of each evaluation phase according to a minimum duration to evaluate the output signals according to the input signals, and of adjusting the duration of each evaluation phase.

27 Claims, 6 Drawing Sheets

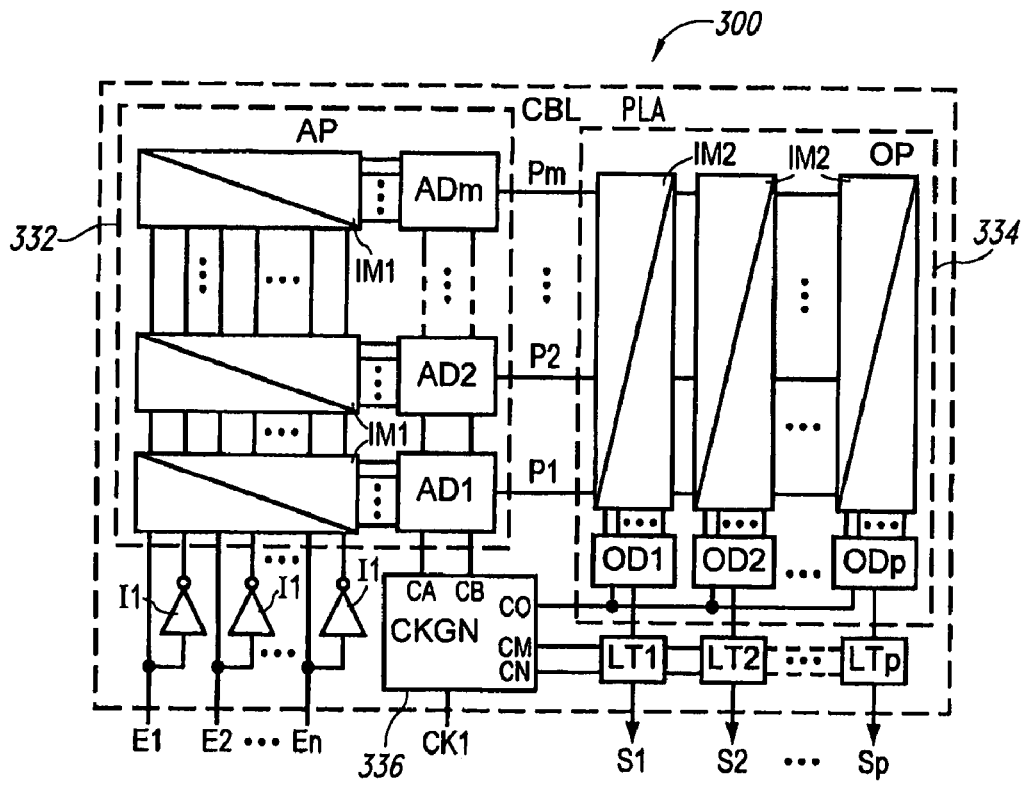
FIG. 3
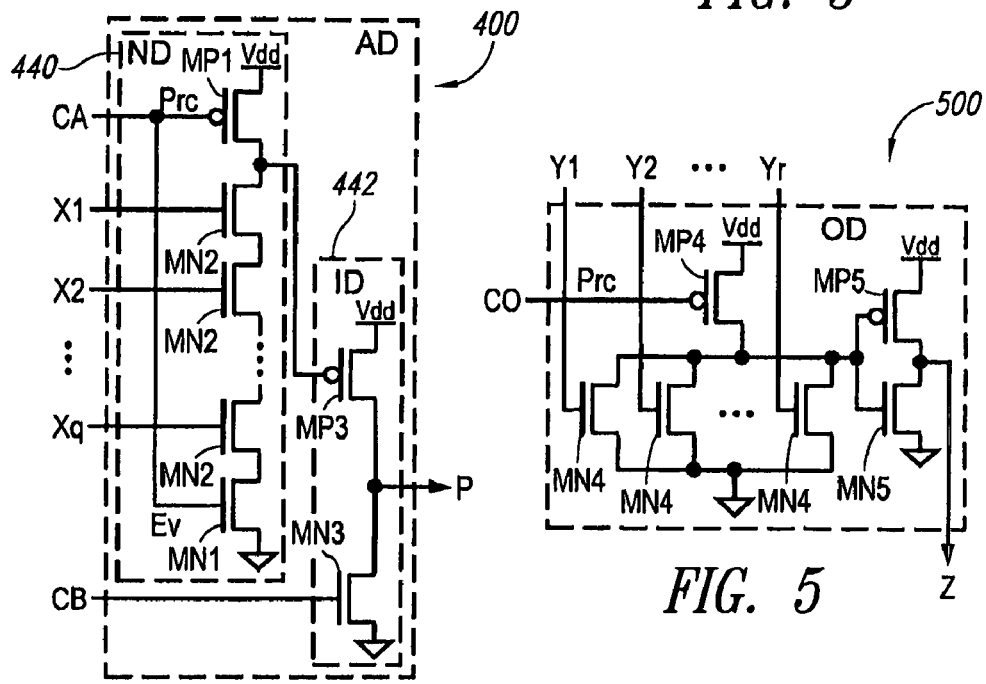
FIG. 4
FIG. 5

METHOD FOR CONTROLLING THE EVALUATION TIME OF A STATE MACHINE

BACKGROUND OF THE INVENTION

1. Field of the Invention

The present disclosure relates to state machines and in particular those used in integrated circuits.

2. Description of the Related Art

A state machine is a sort of automaton the operation of which is modeled by a set of states linked to each other by transitions. A finite state machine comprises a finite number of states, each state being determined by the so-called state values of a set of signals. The change from a current state to a next state linked to the current state by a transition is performed according to the state signals.

Classically, a state machine comprises input signals and output signals generated according to the input signals upon each transition triggered by an active edge of a clock signal. The input and output signals of a state machine may include primary signals and secondary signals. The primary input signals are the signals that the state machine receives from the "external environment". The primary output signals are the signals that the state machine sends to the external environment. The secondary output signals produced by the state machine are stored, for example, using flip-flops to be used as secondary input signals upon the next transition.

FIG. 1 represents a state machine in block form. In FIG. 1, the state machine FSM 100 comprises a combinational logic circuit CBL 102 and a set of latches LTS 104. All the secondary outputs 106 of the circuit CBL 102 are connected to the set of latches LTS 104. The circuit CBL 102 comprises primary inputs PI 108 and primary outputs PO 110. The circuit CBL 102 also comprises secondary inputs SI 112 and secondary outputs SO 106. The secondary outputs SO 106 are connected to the set of latches LTS 104. Sometimes, some or all of the primary outputs 110 may also be secondary outputs 106. The latches of the set LTS 104 enable the current state of the state machine to be stored, i.e., the last values of the primary and secondary output signals generated by the state machine may be stored in the latches of the set of latches LTS 104. The secondary output signals, once locked by the set of latches LTS, become the secondary input signals SI used by the circuit CBL to execute the next transition.

Many electronic circuits use state machines. This is particularly the case of certain memories such as serial access EEPROM (Electrically Erasable Programmable Read-Only Memory) memories.

In such applications, the transitions are generally performed in synchronization with a clock signal CLK 114 supplied by a communication bus. The primary input signals generally comprise signals received by the memory, and other signals internal to the memory. The primary output signals are control signals controlling various subsets of the memory (shift registers, memory array decoders, read circuitry, charge pump, etc.).

Certain state machines of integrated circuits are produced using programmable logic arrays PLA. A logic array may comprise an AND array and an OR array each comprising so-called dynamic logic gates. The operation of such logic gates is paced by the clock signal that defines phases of precharging and evaluating the state of the logic gates. The clock signal applied to the state machine corresponds to the external clock signal applied to the integrated circuit when the latter is selected.

The precharge phase may be performed, for example, when the clock signal is in the low state. Upon the rising edge of the clock signal that triggers the evaluation phase, the input signals of the logic array are sampled. During the evaluation phase, the AND and OR arrays are decoded to obtain the output signals of the state machine.

Generally, for the state machine to operate correctly, the input signals should not change state just before and during the active edge of the clock signal CLK. Indeed, an excessively high clock frequency (excessively short evaluation phase in the case of a logic array) generally causes the production of incorrect output signals, which causes the state machine or the assembly (integrated circuit) into which the state machine is integrated to malfunction or even crash. In the case of a memory, such a malfunction can result, for example, in the decoding of incorrect commands, in read (thus reversible) or write (irreversible) data corruption, or in the memory crashing, which can require an initialization by switch-off followed by switch-on.

A disturbance of the clock signal may cause a state machine to malfunction. A disturbance of the clock signal can be involuntary (for example noise on the clock signal of an access bus, interpreted as a brief clock knock), or voluntary. In the latter case, it may be attempts to disturb the operation of a secure circuit, so as to try to violate a securitization function. Indeed, certain EEPROM memories, such as those adapted to specific applications, have securitization functions the operation of which may be more or less linked to the state machine.

BRIEF SUMMARY OF THE INVENTION

In one embodiment, a state machine is protected against disturbances of the clock signal applied to the state machine.

This may be achieved by providing a method for protecting a state machine having an operation modeled by a set of states linked to each other by transitions, the state machine evaluating output signals upon each transition during an evaluation phase according to input signals comprising signals evaluated during a previous transition.

According to one embodiment, the method comprises steps of determining a minimum duration of each evaluation phase according to a minimum duration to evaluate the output signals according to the input signals, and of adjusting the duration of each evaluation phase.

According to one embodiment, the method comprises a step of generating an internal clock signal synchronized with an external clock signal applied to the state machine to trigger a transition, the internal clock signal adjusting the duration of each evaluation phase.

According to one embodiment, the method comprises a step of generating an alert signal that is in an active state if the internal clock signal cannot be synchronized with the external clock signal.

According to one embodiment, each evaluation phase is preceded by a precharge phase of precharging the state machine during which the input signals are applied to the state machine, the method comprising a step of adjusting the duration of each precharge phase to a minimum duration to precharge the state machine.

According to one embodiment, the state machine is produced using a programmable logic array, the evaluation of the minimum duration of the evaluation phase being performed by measuring the propagation time of a signal in a path of the programmable logic array configured to be the slowest of all the possible paths of the signals in the programmable logic array.

According to one embodiment, the measurement of the propagation time of a signal in the slowest path of the programmable logic array is performed by detecting a state change of an output signal of the slowest path.

According to one embodiment, the state change of the output signal of the slowest path triggers the end of the evaluation phase.

In one embodiment, a state machine is provided having an operation modeled by a set of states linked to each other by transitions, and evaluating output signals upon each transition during an evaluation phase according to input signals comprising signals generated during a previous transition.

According to one embodiment, the state machine comprises a control circuit to measure a minimum duration to evaluate the output signals according to the input signals, and to adjust the duration of the evaluation phase to the minimum duration measured.

According to one embodiment, the control circuit generates an internal clock signal synchronized with an external clock signal applied to the state machine to trigger a transition, the internal clock signal adjusting the duration of each evaluation phase.

According to one embodiment, the control circuit comprises means for generating an alert signal that is in an active state if the internal clock signal cannot be synchronized with the external clock signal.

According to one embodiment, each evaluation phase is preceded by a precharge phase of precharging the state machine during which the input signals are applied to the state machine, the control circuit comprising means for adjusting the duration of each precharge phase to a minimum duration to precharge the state machine.

According to one embodiment, the state machine comprises a programmable logic array receiving the input signals of the state machine and generating the output signals of the state machine according to the input signals.

According to one embodiment, the control circuit receives the external clock signal and supplies the internal clock signal to the programmable logic array.

According to one embodiment, the control circuit comprises a signal path of the programmable logic array, that is configured to be the slowest of all the signal paths of the programmable logic array, to measure a minimum propagation time of a signal in the programmable logic array, the duration of the evaluation phase being adjusted to the minimum duration measured.

According to one embodiment, the state machine comprises means for detecting a state change of an output signal of the slowest path of the programmable logic array, and triggering the end of the evaluation phase following the state change of the output signal of the slowest path.

In one embodiment, a programmable logic array receives input signals and evaluates output signals according to the input signals during an evaluation phase.

According to one embodiment, the logic array comprises a control circuit to measure a minimum duration to evaluate the output signals according to the input signals, and to adjust the duration of the evaluation phase to the minimum duration measured.

According to one embodiment, the control circuit generates an internal clock signal that adjusts the duration of the evaluation phase.

According to one embodiment, the evaluation phase is preceded by a precharge phase during which the input signals are applied to the programmable logic array, the control circuit comprising means for adjusting the duration of the precharge phase to a minimum duration to precharge the input signals in the programmable logic array.

According to one embodiment, the control circuit comprises a signal path of the programmable logic array, that is configured to be the slowest of all the signal paths of the programmable logic array, to measure a minimum propagation time of a signal in the programmable logic array, the duration of the evaluation phase being adjusted to the minimum duration measured.

According to one embodiment, the logic array comprises means for detecting a state change of an output signal of the slowest path of the programmable logic array, and triggering the end of the evaluation phase following the state change of the output signal of the slowest path.

In one embodiment, an integrated circuit comprises means for selectively determining a set of states based on a set of inputs in response to a received signal; and means for setting a duration of a phase of a determination by the means for selectively determining, a length of the duration of the phase being independent of the received signal. In one embodiment, the means for selectively determining comprises a programmable logic array. In one embodiment, the phase comprises an evaluation phase. In one embodiment, the phase comprises a precharge phase. In one embodiment, the means for setting is configured to set the duration based on a propagation of signals in the means for selectively determining. In one embodiment, the propagation of signals comprises a propagation of signals on a test path in a set of paths and the test path is configured to have a slowest propagation time of the paths in the set of paths. In one embodiment, the state machine further comprises means for generating an error signal in response to an error condition of the means for setting a duration.

In one embodiment, a system comprises a state generator (such as, for example, state circuitry) configured to selectively generate a set of outputs based on a set of inputs in response to a received signal, a memory configured to store selected outputs of the set of outputs, and a controller configured to control a duration of a phase of the state generator, wherein a length of the duration is independent of the received signal. In one embodiment, the controller is configured to generate an internal clock signal based on a propagation of signals through a signal path in the state generator and the internal clock signal controls the duration of the phase. In one embodiment, the signal path is a path in a set of signal paths configured to have a longer propagation time period than the other paths in the set of signal paths. In one embodiment, the phase comprises an evaluation phase. In one embodiment, the controller is further configured to control a duration of precharge phase. In one embodiment, the system further comprises an alert generator configured to generate an alert signal in response to an error condition. In one embodiment, the received signal is a clock pulse, the controller is configured to selectively set an internal signal in response to the clock pulse and to selectively reset the internal signal, and the error condition is a receipt of a second clock pulse before the internal signal is reset. In one embodiment, the system further comprises a programmable logic array including the state generator. In one embodiment, the programmable logic array includes the controller.

BRIEF DESCRIPTION OF THE SEVERAL VIEWS OF THE DRAWINGS

FIG. 3 represents in block form an embodiment of a programmable logic array suitable for use in the embodiment of FIG. 2.

FIG. 4 illustrates an embodiment of a product logic circuit suitable for use in the embodiment of FIG. 3.

FIG. 5 illustrates an embodiment of a sum logic circuit suitable for use in the embodiment of FIG. 3.

DETAILED DESCRIPTION OF THE INVENTION

Figure 1:
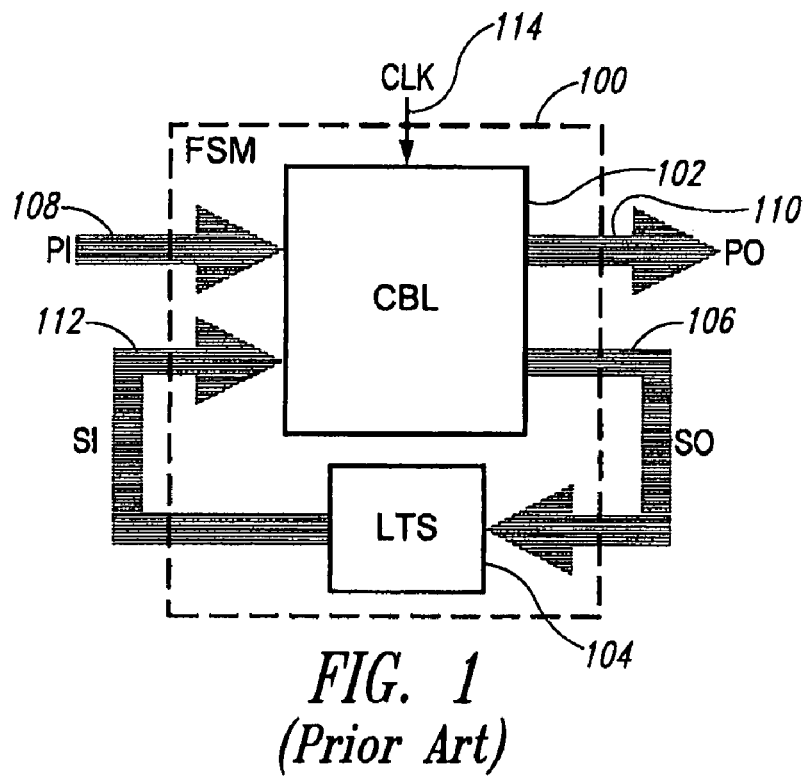
FIG. 1 previously described represents in block form a state machine according to the prior art.
Figure 2:
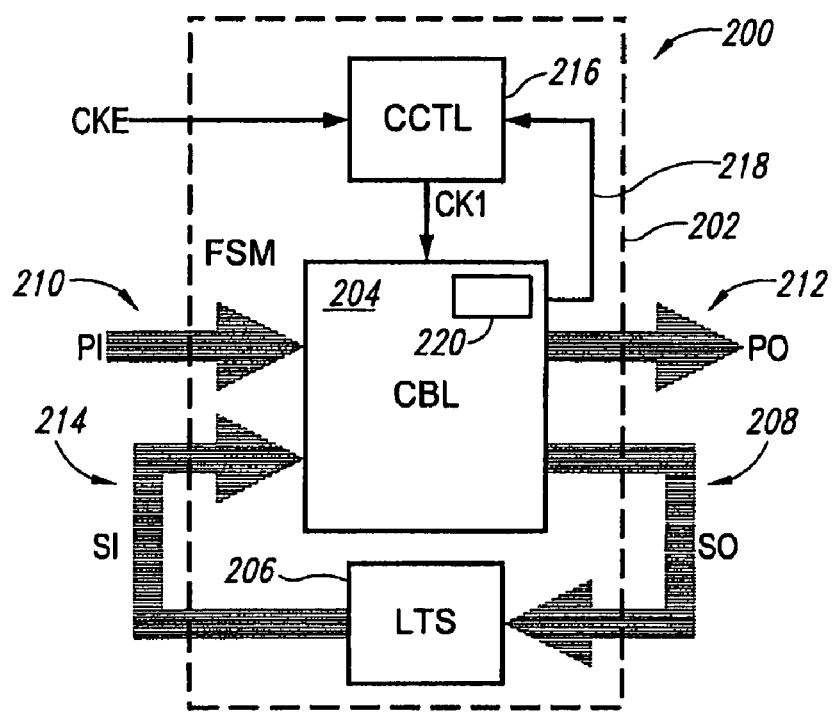
FIG. 2 represents in block form a state machine according to an embodiment.

FIG. 2 represents a system 200 comprising a state machine 202 according to one embodiment. In FIG. 2, the state machine FSM 202 comprises a combinational logic circuit CBL 204 and a set of latches LTS 206. All the secondary outputs 208 of the circuit CBL 204 are connected to the set of latches LTS 206. The circuit CBL 204 comprises primary inputs PI 210 and primary outputs PO 212. The circuit CBL 204 also comprises secondary inputs SI 214 and secondary outputs SO 208. The secondary outputs SO 208 are connected to the set of latches LTS 206. In some embodiments, some or all of the primary outputs 212 will also be secondary outputs 208. The latches of the set LTS 206 enable the states of the state machine to be stored, i.e., the values of the primary and secondary output signals generated by the state machine. Once stored by the set of latches LTS 206, the secondary output signals SO become the secondary input signals SI used by the circuit CBL to execute the next transition.

According to one embodiment, the state machine comprises a control circuit for controlling the clock signal CCTL 216 supplying the circuit CBL 204 with an internal clock signal CK1 using an external clock signal CKE. The internal clock signal CK1 determines the duration of a phase of evaluating the output signals of the state machine based on signals 218 generated by the CBL 204. As illustrated, the CBL 204 has an internal clock module 220 configured to generate the signals 218. In particular, the internal clock signal CK1 adjusts the duration of the evaluation phase to a threshold duration to correctly evaluate the output signals (PO, SO). In some embodiments, the CCTL 216 and the internal clock module 220 may be part of the CBL 204. In some embodiments, the CCTL 216 and the internal clock module 220 may be combined into a single functional block, which may be part of the CBL 204. Thus, the risks of malfunction of the state machine resulting from disturbances of the external clock signal may be avoided.

FIG. 3 represents one embodiment of a combinational logic circuit CBL that may be employed, for example, in the embodiment of FIG. 2. In FIG. 3, the circuit CBL 300 receives input signals E1, E2, ... En and supplies output signals S1, S2, ... Sp resulting from the application of logic functions to the signals E1, E2, ... En.

The circuit CBL 300 may comprise a programmable logic array PLA that receives the input signals E1-En, and that supplies the output signals S1-Sp. The signals S1-Sp are, in a determined manner, the sum of products of the signals E1-En.

The illustrated programmable logic array 300 comprises an input stage AP 332, also referred to as "AND array" applying AND logic or product functions to the input signals E1-En, and an output stage OP 334, also referred to as "OR array" applying OR or sum functions to the output signals P1, P2, ... Pm of the stage AP 332.

The programmable logic array 300 comprises inverters I1 receiving the input signals E1-En and the outputs of which are connected to inputs of the input stage AP 332. Thus, the input stage AP 332 receives both the input signals and the inverted input signals. The outputs of the programmable logic array made up of the outputs of the output stage OP are connected to output latches LT1, LT2, ... LTp, which each store an output signal S1-Sp of the circuit CBL. The programmable logic array comprises a clock signal generating circuit CKGN 336 pacing the input AP 332 and output OP 334 stages, and the latches LT1-LTp.

The input stage AP 332 of the circuit CBL 300 comprises several product logic circuits AD1, AD2, ... ADm each performing an AND logic function, with several inputs and one output P1, P2, ..., Pm, and interconnection matrices IM1 each selectively connecting selected inputs of the input stage AP 332 grouping together the inputs E1-En of the circuit CBL 300 and the inverted inputs thereof to selected inputs of one of the product logic circuits AD1-ADm. Thus, if the circuit CBL 300 comprises n inputs E1-En, and if each circuit AD1-ADm comprises q inputs at the most, each interconnection matrix IM1 may comprise 2n inputs and q outputs. Generally, the number q of inputs of each product circuit is at the most equal to the number n of inputs of the programmable logic array. The outputs P1-Pm of the circuits AD1-ADm form the outputs of the input stage AP 332.

The output stage OP 334 of the circuit CBL 300 comprises several sum logic circuits OD1, OD2, ... ODp each performing an OR or sum function, with several inputs and one output, and interconnection matrices IM2 each selectively connecting selected outputs P1-Pm of the input stage AD to selected inputs of one of the product logic circuits OD1-ODp. If the circuit CBL 300 comprises m circuits AD1-ADm, and if each sum logic circuit OD1-ODp comprises r inputs at the most, each interconnection matrix IM2 may comprise m inputs and r outputs. Generally speaking, the number r of inputs of the sum circuits is lower than the number m of sum circuits. The outputs of the circuits OD1-ODp form the outputs of the output stage OP 334 and are each connected to the input of a latch LT1-LTp.

The configuration of the interconnection matrices IM1, IM2 determines the logic function performed by the circuit CBL.

In the following description, the references starting with "MN" are used to designate an N-channel MOS transistor and the references starting with "MP" are used to designate a P-channel MOS transistor.

FIG. 4 is a wiring diagram of an embodiment of a product logic circuit AD 400 suitable for use in the input stage AP 332 of FIG. 3. In FIG. 4, the circuit AD 400 comprises an input branch ND 440 performing a dynamic inverted AND logic function, and an output branch ID 442 performing the function of a dynamic inverter, the output of which forms an output P of the circuit AD.

The input branch ND 440 of the circuit AD 400 comprises a group of several transistors MN2 arranged in series. The gate of each transistor MN2 is connected to a respective input X1-Xq of the circuit AD. The group of transistors MN2 comprises a first transistor MN2 the gate of which is connected to a first input X1 of the circuit AD 400, and the drain of which is connected to the drain of a transistor MP1. The gate of the transistor MP1 receives a clock signal CA, and the drain of this transistor receives a supply voltage Vdd. The transistor MP1 precharges the transistors MN2. The group of transistors MN2 comprises a last transistor MN2 the gate of which is connected to a last input Xq of the circuit AD, and the source of which is connected to the drain of a transistor MN1. The gate of the transistor MN1 receives the clock signal CA, and the source of this transistor is connected to the ground. The connection node for connecting the drain of the transistor MP1 to the drain of the first transistor MN2 forms the output of the dynamic inverted AND logic function. The transistor MN1 enables the dynamic inverted AND logic function performed by the transistors MN2 to be evaluated, further to the precharge thereof. The clock signal CA determines phases of precharging (CA=0) and evaluating (CA=1) the input branch ND 440 of the circuit AD 400.

The output branch ID 442 of the circuit AD 400 comprises a transistor MP3 the gate of which is connected to the output of the input branch ND, i.e., to the drain of the transistor MP1 and to the drain of the first transistor MN2. The source of the transistor MP3 receives the supply voltage Vdd. The output branch ID 442 comprises a transistor MN3 the gate of which receives a clock signal CB, the source of which is grounded and the drain of which is connected to the drain of the transistor MP3 and to the output P of the circuit AD 400.

The transistor MN3 triggers the phases of precharging, then of evaluating the dynamic inversion logic function performed by the transistor MP3. The clock signal CB determines phases of precharging (CB=1) and evaluating (CB=0) the output branch ID 442 of the circuit AD 400.

FIG. 5 is the wiring diagram of a sum logic circuit OD 500 suitable of use in the output stage OP 334 of FIG. 3. In FIG. 5, the circuit OD 500 comprises several transistors MN4 arranged in parallel, the source of which is connected to the ground. The gate of each of the transistors MN4 is connected to a respective input Y1-Yr of the circuit OD 500. The drain of the transistors MN4 is connected to the drain of a transistor MP4 the source of which receives the supply voltage Vdd, and the gate of which receives a clock signal CO. The transistors MN4 perform a dynamic inverted OR function. The drain of each of the transistors MN4 forms an output of the function, which is connected to the input of an inverter. The inverter is formed by two transistors MN5, MP5 the gates of which constitute the input of the inverter. The source of the transistor MN5 is connected to the ground, while the source of the transistor MP5 receives the supply voltage Vdd. The drains of the transistors MN5 and MP5 that constitute the output of the inverter supply an output signal Z of the circuit OD 500.

The transistor MP4 enables the dynamic inverted OR logic function performed by the transistors MN4 to be evaluated, further to the precharge thereof. The clock signal CO controlling the transistor MP4 determines phases of precharging (CO=0) and evaluating (CO=1) the circuit OD.

Figure 6:
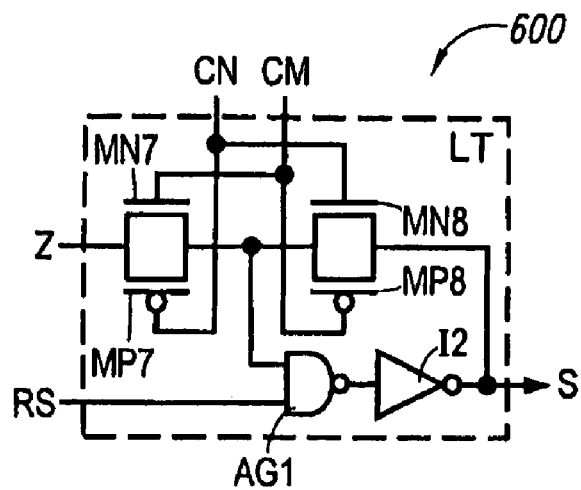
FIG. 6 illustrates an embodiment of a latch suitable for use in the embodiment of FIG. 3.

FIG. 6 is the wiring diagram of an embodiment of a latch LT 600 suitable for use in the embodiment of FIG. 3. The latch LT 600 comprises transistors MN7, MP7 mounted in parallel. The drain of the transistor MN7 and the source of the transistor MP7 receive the output signal Z of a product logic circuit OD (see product logic circuit OD 500 in FIG. 5). The gate of the transistor MN7 is controlled by a clock signal CM, while the gate of the transistor MP7 is controlled by a clock signal CN. The source of the transistor MN7 and the drain of the transistor MP7 are connected to the input of an inverted AND-type logic gate AG1, as well as to the source of a transistor MN8 and to the drain of a transistor MP8. The gate of the transistor MN8 receives the clock signal CN, while the gate of the transistor MP8 receives the clock signal CM. Another input of the gate AG1 receives a reset signal RS. The output of the gate AG1 is connected to the input of an inverter I2 the output of which is connected to the drain of the transistor MN8 and to the source of the transistor MP8. The output of the inverter I2 is an output S of the latch LT 600.

The clock signals CM and CN determine phases of charging (CM=1, CN=0) and locking (CM=0, CN=1) the latch LT 600. The latch LT 600 in the locked state (signals CM and CN respectively on 0 and 1) can be initialized to 0 (S=0) by applying a reset signal RS on 0.

Figure 7:
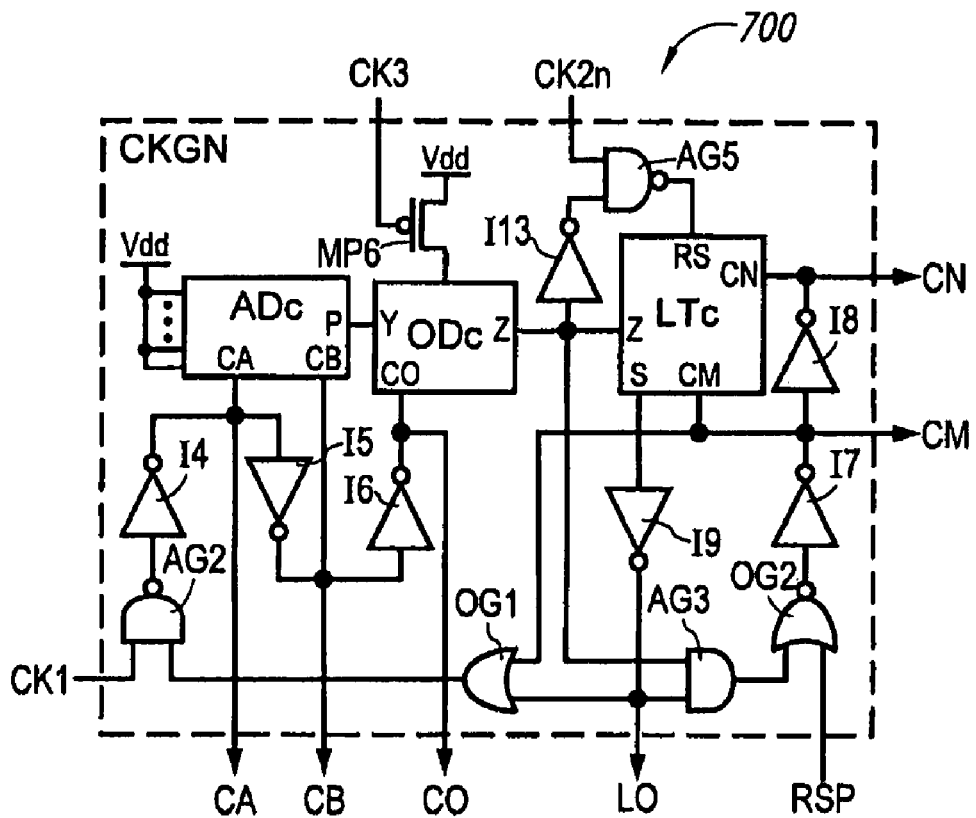
FIG. 7 illustrates an embodiment of a clock generator suitable for use in the embodiment of FIG. 3.

FIG. 7 is a wiring diagram of the clock signal generating circuit CKGN 700 suitable for use in the circuit CBL 300 of FIG. 3. The circuit CKGN 700 comprises a product logic circuit ADc, a sum logic circuit ODc, and a latch LTc. The embodiment of a product logic circuit 400 illustrated in FIG. 4, the embodiment of the sum logic circuit 500 illustrated in FIG. 5 and the embodiment of a latch 600 illustrated in FIG. 6 may be employed in the embodiment of a clock signal generator 700 illustrated in FIG. 7. The inputs X1-Xq of the circuit ADc are connected to the supply voltage source Vdd. The output P of the circuit ADc is connected to the input Y of the circuit ODc. The output Z of the circuit ODc is connected to the input Z of the latch LTc. The circuit ODc (source of the transistor MP5) receives the supply voltage Vdd through a transistor MP6 controlled by a signal CK3. The output S of the latch LTc supplies an output signal LO of the circuit CKGN 700 through an inverter I9.

The circuit CKGN 700 comprises an inverted AND-type logic gate AG2 receiving the internal clock signal CK1. The output of the gate AG2 is connected to the input of an inverter I4 the output of which supplies the clock signal CA that is applied to the product circuits ADc, AD1-ADm of the input stage AP (see FIG. 3), including the product circuit ADc of the circuit CKGN 700.

The circuit CKGN 700 comprises an inverter I5 receiving the clock signal CA and supplying the clock signal CB also applied to the product circuits AD1-ADm and ADc. The circuit CKGN 700 comprises an inverter I6 receiving the clock signal CB and supplying the clock signal CO applied to the sum circuits ODc, OD1-ODp of the output stage OP, including the sum circuit ODc of the circuit CKGN.

The circuit CKGN 700 comprises an AND-type logic gate AG3 one input of which is connected to the output Z of the circuit ODc and the output of which is connected to the input of an inverted OR-type logic gate OG2. Another input of the gate OG2 receives a reset signal RSP and the output of this gate is connected to the input of an inverter I7 the output of which supplies the clock signal CM that is applied to the latch LTc and to an input of an OR-type logic gate OG1. The output of the gate OG1 is connected to an input of the gate AG2.

The output Z of the circuit ODc is also linked to the input of an AND-type logic gate AG5 through an inverter I13. Another input of the gate AG5 receives a clock signal CK2n. The output of the gate AG5 is connected to the reset input RS of the latch LTc.

The circuit CKGN 700 comprises an inverter I8 receiving the clock signal CM and supplying the clock signal CN applied to the latches LTc and LT1-LTp. The output S of the latch LTc is connected to the input of an inverter I9 the output of which is connected to an input of the gate AG3, to an input of the gate OG1, and to an output LO of the circuit CKGN 700.

Figure 8:
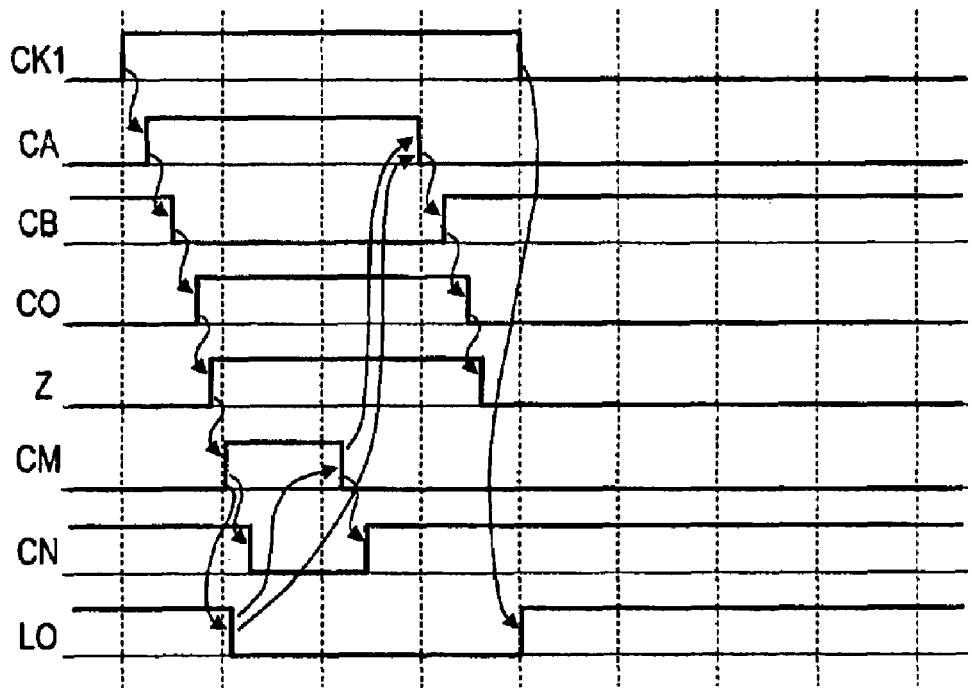
FIG. 8 shows in the form of timing diagrams the operation of the circuit represented in FIG. 7.

FIG. 8 shows in the form of timing diagrams the operation of the clock signal generating circuit CKGN 700. FIG. 8 represents the timing diagrams of the clock signals CK1, CA, CB, CO, CM and CN, of the output signal Z of the circuit ODc and of the output signal LO of the latch LTc of the circuit CKGN 700. In an initial state, the clock signals CA, CO, and CM, and the output signal Z of the circuit ODc are on 0, while the clock signals CB and CN and the output signal LO of the latch LTc are on 1. The result is that the precharge of the input stage AP and of the output stage OP starts.

Upon the arrival of a rising edge of the clock signal CK1, in the initial state of the circuit CKGN 700, the clock signal CA changes to 1, marking the end of the precharge of the input stage AP and thus the start of the evaluation of the input branches ND of the input stage. At the end of the precharge of the input stage AP, the clock signal CB at output of the inverter I5 then changes to 0. The outputs P1-Pm of the input stage AP are then valid. In fact, the outputs P1, Pm are only valid for a certain amount of time after the start of the evaluation of the input stage due to the propagation time of the input signals E1-En in the input branches ND. To be sure that this propagation time is over, and therefore that the outputs P1-Pm of the input stage AD are valid, the circuit ADc of the circuit CKGN 700 comprises a greater number of inputs than the number n of inputs E1-En of the circuit CBL, i.e., than the number q of inputs of each circuit AD1-ADp. The circuit ADc is thus the slowest of all the product circuits AD1-ADm, ADc of the circuit CBL to supply a valid output signal P.

When the output of the circuit ADc switches, the signal CO changes to 1, triggering the end of the precharge of the output stage OP and therefore the start of the evaluation phase of this stage. The output signal P of the product circuit ADc of the circuit CKGN 700 then changes to 1. To be sure that the propagation time of the signals in the output stage OP is over, and thus that the outputs Z1-Zp of the output stage OP are valid, the number of inputs of the circuit ODc is chosen to be greater than the total number of circuits ADc, AD1-ADp used, one input Y of the circuit ODc being connected to the output P of the circuit ADc, while all the other inputs of the circuit ODc are connected to the ground. Thus, when the output Z of the circuit ODc switches, it is certain that all the outputs Z1-Zp of the circuits OD1-ODp have had time to switch.

The two inputs of the gate AG3 are then on 1. The result is that the clock signal CM changes to 1. The change to 1 of the clock signal CM causes the clock signal CN to change to 0 through the inverter I8 and a state change of the output signal LO of the inverter I9 at the output of the latch LTc that changes to 0.

The change to 0 of the signal LO causes the clock signal CM to change to 0, then the clock signal CN to change to 1. The output signals Z, Z1-Zp of the circuits ODc, OD1-ODp are thus locked by the latches LTc, LT1-LTp as soon as they are valid. The state change of the signal CM causes the signal CA to change to 0 through the gates OG1, AG2 and the inverter I4. The change to 0 of the signal CA causes the signal CB to change to 1, and then the signal CO to change to 0, and finally the output signal Z of the circuit ODc to change to 0. The phase of evaluating the input AP and output OP stages is therefore stopped, to restart a new phase of precharging the input AP and output OP stages. The change to 0 of the signal LO thus triggers the end of the evaluation phase in the input AP and output OP stages, emulated by the circuits ADc and ODc.

Upon the falling edge of the clock signal CK1, a rising edge appears in the clock signal CK2n that sets the latch LTc. The output signal LO of the inverter I9 then changes back to 1.

During the new precharge phase, the input signals E1-En take a new value corresponding to a new input state of the state machine FSM, stored by the set of latches LTS. Then, the process previously described restarts to execute a new transition of the state machine.

Generally, all the inputs E1-En should be stable a little before the rising of the clock signal CK1, and at least until the falling of the clock signal CM.

The last event before the arrival of the falling edge of the primary clock signal CK1 is the change to 0 of the clock signal CO. If the falling edge of the clock signal CK1 appears before the signal CO falls back, due to a fortuitous or voluntary disturbance, the operation of the circuit CKGN will be disturbed and will generate clock signals CA, CB, CO, CM, CN which do not enable the product circuits AD, the sum circuits OD and the latches LT of the circuit CBL to be correctly synchronized. The circuit CBL may therefore generate incorrect output signals.

Figure 9:
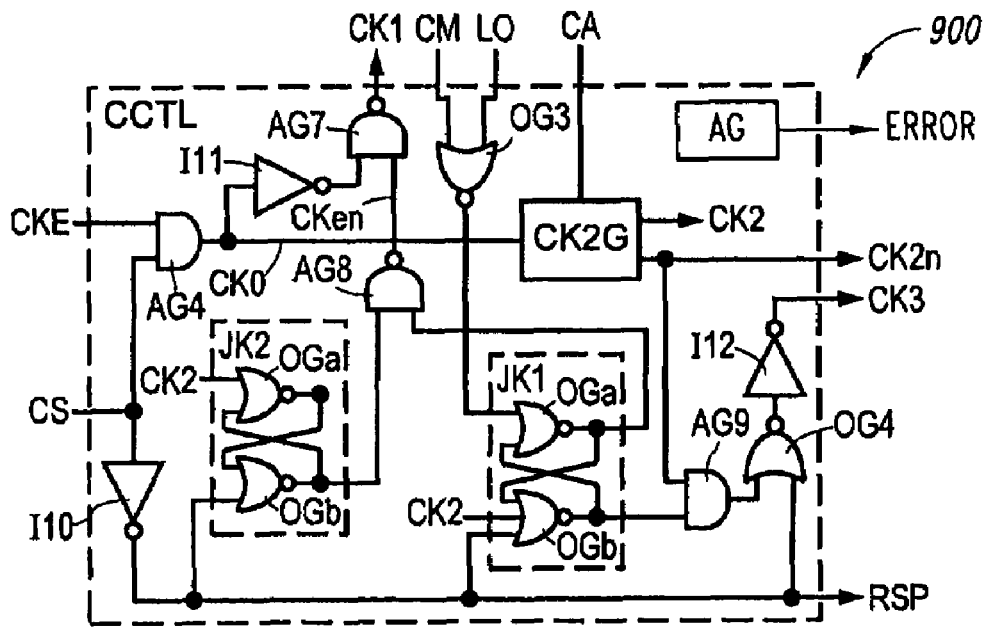
FIG. 9 represents an embodiment of a device for generating an internal clock signal according to one embodiment.

To reduce this risk, the state machine comprises, according to one embodiment, a clock signal control circuit CCTL 900. An example of clock signal control circuit CCTL 900 is represented in FIG. 9. The circuit CCTL 900 comprises an AND-type logic gate AG4 one input of which receives the external clock signal CKE and another input of which receives a selection signal CS for selecting the component integrating the state machine. Thus, the signal CK0 at output of the gate AG4 has clock pulses only when the component is selected. The signal CK0 is applied to the input of an inverter I11 and to the input of a secondary clock signal generating circuit CK2G supplying two secondary clock signals CK2 and CK2n that complement each other. The output of the inverter I11 is connected to the input of an inverted AND-type logic gate AG7 the output of which supplies the internal clock signal CK1 that is applied at input of the clock signal generating circuit CKGN.

The circuit CCTL comprises two flip-flops JK1, JK2, which as illustrated are of JK type classically comprising two inverted OR-type logic gates OGa, OGb, the output of each gate OGa, OGb being connected to an input of the other gate OGb, OGa. The non-connected inputs of each gate OGa, OGb constitute an input of the flip-flop and the output of each gate constitutes an output of the flip-flop. The circuit CCTL 700 comprises an inverted OR-type logic gate OG3 the inputs of which receive the signals CM and LO supplied by the circuit CKGN (see FIG. 7) and the output of which is connected to the input of the gate OGa of the flip-flop JK1. The gate OGb of the flip-flop JK1 receives the signal CK2 as well as a signal RSP corresponding to the selection signal CS previously inverted by an inverter I10. The output of the gate OGa of the flip-flop JK1 is connected to the input of an inverted AND-type logic gate AG8, the output of which supplies a signal CKen that is applied to the input of the gate AG7. The output of the gate OGb of the flip-flop JK1 is connected to the input of an AND-type logic gate AG9 another input of which receives the signal CK2n. The output of the gate AG9 is connected to the input of an inverted OR-type logic gate OG4. Another input of the gate OG4 receives the signal RSP. The output of the gate OG4 supplies the signal CK3 to the circuit CKGN (see FIG. 7) through an inverter I12.

The input of the gate OGa of the flip-flop JK2 receives the signal CK2. The input of the gate OGb of the flip-flop JK2 is connected to the output of the inverter I10 that supplies the signal RSP to the circuit CKGN. The output of the gate OGb of the flip-flop JK2 is connected to the input of the gate AG8.

As illustrated, the CCTL 900 comprises an alert generator configured to generate one or more error signals upon detecting a clock disturbance or other clock error, as discussed in more detail below.

Figure 10:
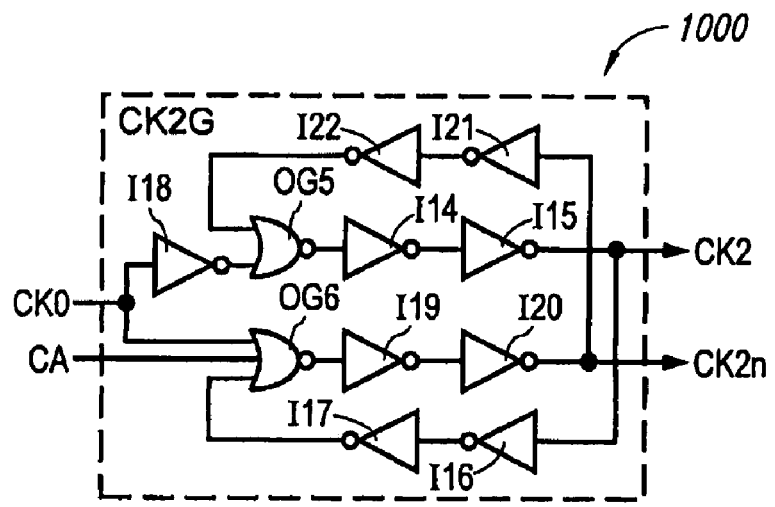
FIG. 10 illustrates an embodiment of a secondary clock circuit.

FIG. 10 illustrates an embodiment of a secondary clock signal generating circuit CK2G 1000 suitable for use in the embodiment of FIG. 9. The circuit CK2G 1000 comprises two inverted OR-type logic gates OG5, OG6, the gate OG6 receiving the signal CK0, and the gate OG5 receiving the signal CK0 through an inverter I18. The output of the gate OG5 is connected to two cascade-arranged inverters I14, I15. The output of the inverter I15 supplies the signal CK2 and is linked to an input of the gate OG6 through two cascade-arranged inverters I16, I17. The output of the gate OG6 is connected to two cascade-arranged inverters I19, I10. The output of the inverter I10 supplies the signal CK2$n$ and is linked to an input of the gate OG5 through two inverters I21, I22. The gate OG6 also receives at input the signal CA supplied by the circuit CKGN. The circuit CK2G enables non-overlapping pulses of clock signals (the signals CK2 and CK2$n$ are never on 1 simultaneously) to be generated.

Figure 11:
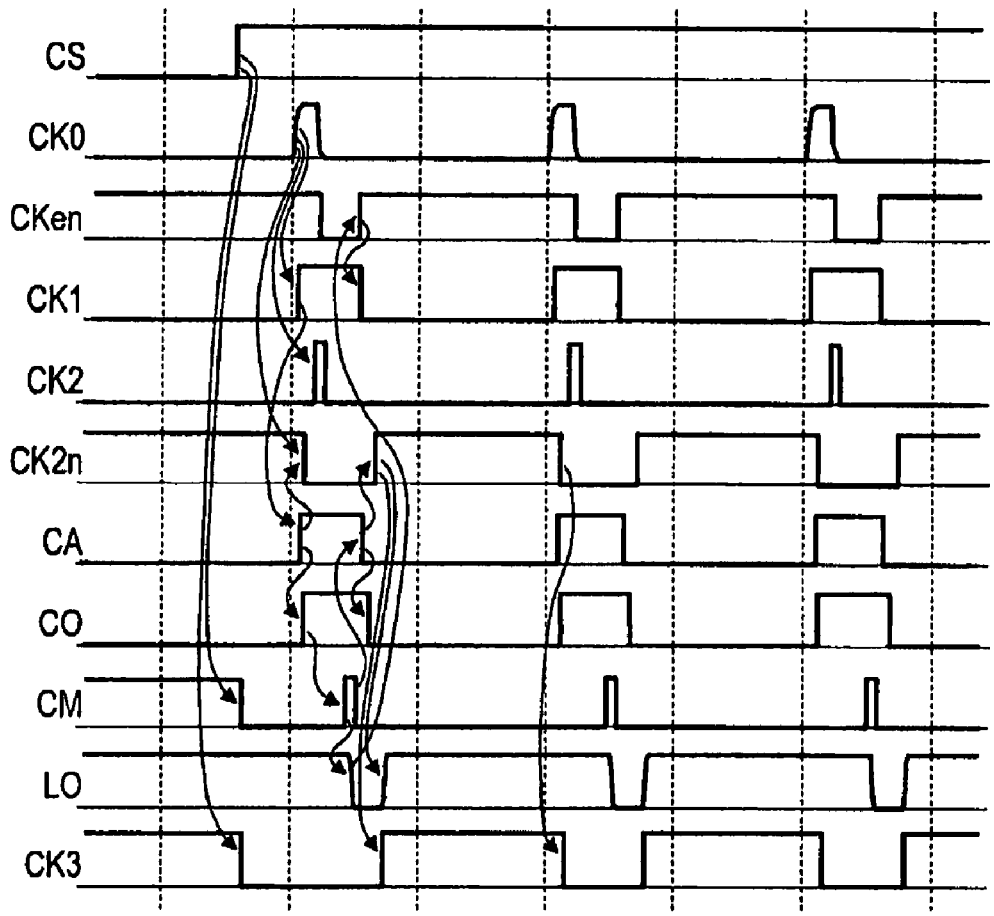
FIG. 11 shows in the form of timing diagrams the operation of the embodiment of an internal clock generating device represented in FIG. 9.

FIG. 11 shows in the form of timing diagrams the operation of the clock signal control circuit CCTL illustrated in FIG. 9. FIG. 10 represents the timing diagrams of the signals CS, CK0, CKen, CK1, CK2, CK2$n$, CA, CO, LO, CM and CK3. In an initial state, the selection signal CS is on 0: the component integrating the programmable logic array is not selected. The signals CK0, CK2, CA, CO are on 0, while the signals CK2$n$, LO, CM and CK3 are on 1.

The signal CK0 has pulses corresponding to the pulses of the external clock signal CKE, from the moment the selection signal CS changes to 1. The signal CK2 and the signal CK2$n$ have one pulse upon each pulse of the signal CK0. The pulses of the signal CK2 are shorter than those of the signal CK0, while those of the signal CK2$n$ are longer than those of the signal CK0.

The change to 1 of the signal CS causes the signals CM, then CK3 to change to 0. Thus, the signal CK3 changes to 1 as soon as the signal LO changes to 0, while the signal CM is in the low state. Furthermore, the inverter I13 at output of the circuit ODc is controlled by the signal CK3 during the evaluation phase so as to condition the rising of the signal CM only when the signal CK3 is on 0, thus preventing an overlapping of the clock signals CM and CK3 (signals simultaneously on 1).

The signal CA generated by the circuit CKGN using the signal CK1, changes to 1 upon the arrival of a rising edge of the primary clock signal CK1, marking the end of the phase of precharging the input stage AP and therefore the start of the phase of evaluating the input branches ND of the input stage AP. The change to 1 of the signal CA causes the signal CO to change to 1, marking the start of the phase of evaluating the output stage OP. The change to 1 of the signal CO causes a little later the change to 1 of the output Z of the circuit ODc, and therefore the change to 1 of the signal CM. The change to 1 of the signal CM is followed by the change to 0 of the signal LO at output of the latch LTc.

The change to 1 of the signal CK2 causes the signal CKen to change to 0 through the flip-flops JK1 and JK2. The change to 0 of the signal CKen forces the clock signal CK1 to 1. Thus, it is certain that the clock signal CK1 pacing the circuit CBL does not change to 0 before the end of the phase of charging the latches LT1-LT$p$.

Figure 12:
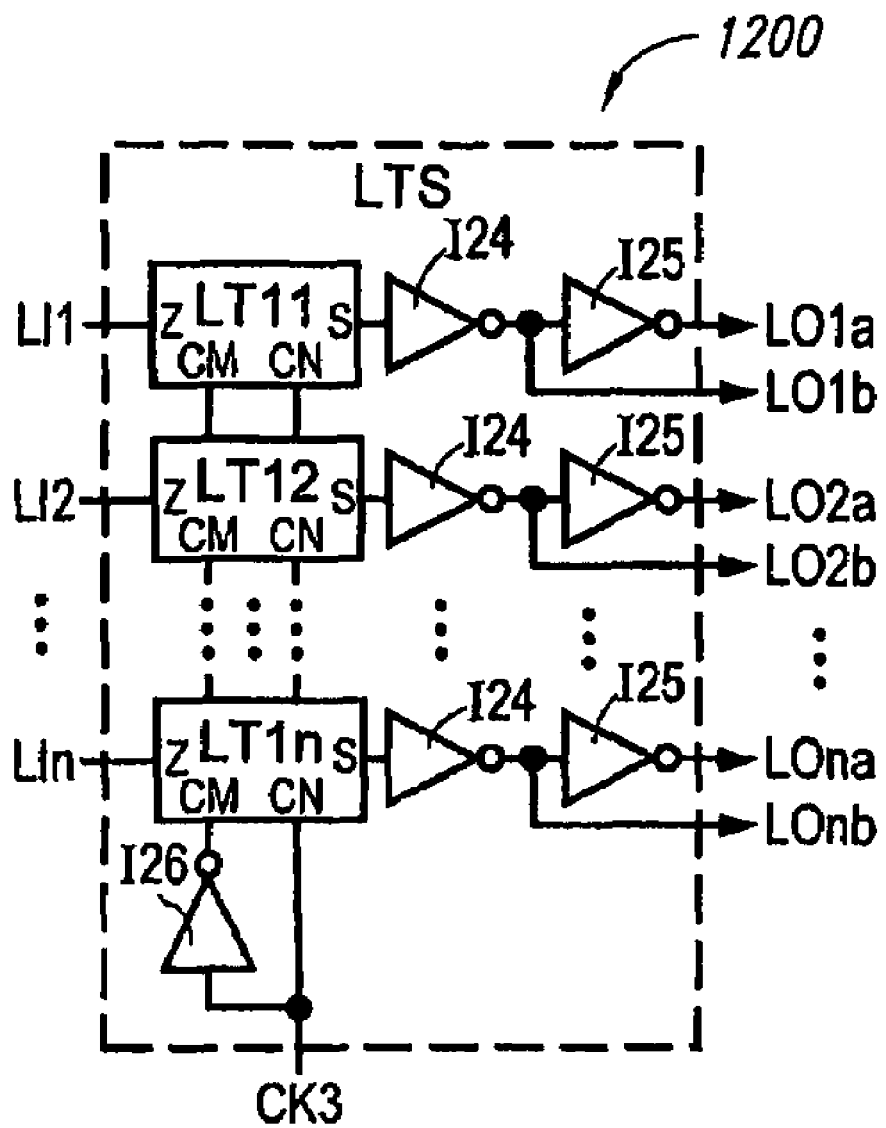
FIG. 12 is an embodiment of an electric circuit of a set of latches storing the current state of the state machine represented in FIG. 2.

FIG. 12 illustrates an embodiment of a set of latches LTS 1200 suitable for use in the embodiment of FIG. 2. The set of latches LTS comprises n branches. Each branch $i$ ($i$ being a whole number varying from 1 to n) comprises an input L$i$ connected to an output S1-S$p$ of the circuit CBL, a latch LT1$i$ connected to the input L$i$, and two cascade-arranged inverters I24, I25 connected to an output of the latch LT1$i$. The output of each of the inverters I24, I25 constitutes an output LO$ia$ LO$ib$ of the branch. Each latch LT1$i$ is of the type represented in FIG. 6. The clock signal CN, CM inputs of each of the latches receive the signal CK3 and this same signal previously inverted by an inverter I26. The signal CK3 is therefore used to trigger the storing of the output signals of the latches LT1-LT$p$ in the set of latches LTS. As the clock signals CM and CK3 do not overlap (are not simultaneously on 1), the phase of storing by the latches LTS is triggered following the phase of storing in the latches LT1-LT$p$.

As a result of these provisions, the active edges of the external clock signal CKE (CK0) are only used to synchronize the internal clock signal CK1 used to trigger and stop the evaluation phase. The interruption of the evaluation phase, i.e., the change to 0 of the clock signal CK1, is in fact triggered by determining the propagation time of the signals in the circuits ADc and ODc of the input AP and output OP stages. The circuits ADc and ODc are configured so that the propagation time in these circuits is the longest of all the circuits of the input and output stages. Thus, when the output of the latch LTc at output of the circuit ODc changes state, the signals stored by the other latches LT1-LT$p$ are stabilized signals obtained following a sufficiently long evaluation phase.

If an active edge of the clock signal CK0 appears before the output signals Z of the output stage OP are stored in the latches LT1-LT$p$ (signal CM on 1 and signal CN on 0), the active edge of the clock signal is ignored. The control circuit CCTL may also comprise an alert generating circuit (see FIG. 9) to send an error signal if an active edge of the clock signal CK0 appears before the output signals Z of the output stage OP are stored in the latches LT1-LT$p$ (signal CM on 1 and signal CN on 0 or signal LO on 0). The error signal can thus be generated for example using an AND-type logic gate receiving the signal CK0 and the signal LO previously inverted, and a JK flip-flop connected to the output of the logic gate to store the value of the error signal, and thus the detection of a clock signal error. Provision can also be made for generating an alert signal only if the internal clock signal CK1 cannot be synchronized with the external clock signal.

If an active edge of the clock signal appears as soon as the signal LO has risen again to 1, the duration of the precharge phase can be insufficient for the input AP and output OP circuits to be correctly precharged. The control circuit CCTL can thus comprise a circuit that delays the change to 1 of the signal CA following the change to 1 of the clock signal CK1. The value of the delay applied to the signal CA corresponds to the minimum duration of the precharge of the signals in the input stage AP.

It will be understood by those skilled in the art that various alternative embodiments and applications are possible. For example, the state machine can be produced with circuits other than a programmable logic array. Other means may be employed to ensure a minimum duration for evaluating output signals of a state machine according to the input signals. In some embodiments, a programmable logic array may not necessarily be part of a state machine.

To measure the minimum duration of the evaluation phase, it is not necessary to use a signal path in the programmable logic array. This duration may be determined, for example, a priori according to the signal processing operations performed by the state machine so that the end of the evaluation phase is not triggered by an external event such as a state change of an external clock signal.

It is not essential either to adjust the duration of the precharge phase, given that the signals take a certain time to propagate in the programmable logic array. Thus, the precharge of the input stage AP can start before the end of the storing of the output signals in the latches LTS.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method comprising:
evaluating output signals upon each transition from one state to another state during an evaluation phase of a state machine according to input signals comprising signals evaluated during a previous transition;
determining a minimum duration of the evaluation phase according to a minimum duration to evaluate the output signals according to the input signals;
generating an internal clock signal synchronized with active edges of an external clock signal applied to the state machine, the internal clock signal being in an active state during at least the minimum duration; and
maintaining the state machine in the evaluation phase while the internal clock is in the active state.

2. The method according to claim 1, further comprising generating an alert signal that is in an active state if the internal clock signal cannot be synchronized with an active edge of the external clock signal.

3. The method according to claim 1 wherein the evaluation phase is preceded by a precharge phase of precharging the state machine during which the input signals are applied to the state machine, the method further comprising adjusting the duration of the precharge phase to a minimum duration to precharge the state machine.

4. The method according to claim 1 wherein the state machine comprises a programmable logic array and the determination of the minimum duration of the evaluation phase comprises configuring the programmable logic array to have a slowest signal propagation path and measuring a propagation time of a signal in the slowest signal propagation path.

5. The method according to claim 4 wherein the measurement of the propagation time of a signal in the slowest propagation path of the programmable logic array comprises detecting a state change of an output signal of the slowest path.

6. The method according to claim 5 wherein the state change of the output signal of the slowest path triggers the end of the evaluation phase.

7. A state machine comprising:
a state machine circuit configured to have a set of states linked to each other by transitions, with one state in the set of states being an evaluation phase to evaluate output signals upon each transition according to input signals composing signals generated during a previous transition; and
a control circuit configured to measure a minimum duration of the evaluation phase, to generate an internal clock signal synchronized with active edges of an external clock applied to the state machine, the internal clock signal being in an active state during at least the minimum duration, and to apply the internal clock signal to the state machine circuit to maintain the state machine in the evaluation phase as long as the internal clock signal is in the active state.

8. The state machine according to claim 7 wherein the control circuit is configured to generate an alert signal that is in an active state when the internal clock signal cannot be synchronized with an active edge of the external clock signal.

9. The state machine according to claim 7 wherein the state machine circuit is configured to precede each evaluation phase with a precharge phase of precharging the state machine during which the input signals are applied to the state machine, the control circuit being configured to adjust a duration of each precharge phase to at least a minimum duration to precharge the state machine.

10. The state machine according to claim 7, wherein the state machine circuit comprises a programmable logic array receiving the input signals of the state machine and generating the output signals of the state machine according to the input signals.

11. The state machine according to claim 10 wherein the control circuit receives the external clock signal and supplies the internal clock signal to the programmable logic array.

12. The state machine according to claim 7 wherein the control circuit comprises a signal path of the programmable logic array configured to be a slowest signal path of the programmable logic array, and the control circuit is configured to measure the minimum duration by measuring a propagation time of a signal in the slowest signal path.

13. The state machine according to claim 12 wherein the control circuit is configured to detect a state change of an output signal of the slowest signal path of the programmable logic array, and to deactivate the internal clock signal following the detection of the state change of the output signal of the slowest signal path.

14. A programmable logic array comprising:
a combinational logic configured to receive input signals and evaluate output signals according to the input signals during an evaluation phase; and
a control circuit configured to measure a minimum duration to evaluate the output signals according to the input signals, to generate an internal clock signal synchronized with active edges of an external clock signal, the internal clock signal being in an active state for at least the minimum duration, and to apply the internal clock signal to the combinational logic to maintain it in an active state as long as the internal clock signal is in an active state.

15. The programmable logic array according to claim 14 wherein each evaluation phase is preceded by a precharge phase during which the input signals are applied to the programmable logic array and the control circuit is configured to adjust a duration of the precharge phase to at least a minimum duration to precharge the input signals in the programmable logic array.

16. The programmable logic array according to claim 14 wherein the control circuit comprises a signal path of the programmable logic array that is configured to be a slowest signal path of the programmable logic array, and is configured to measure a propagation time of a signal in the slowest signal path of the programmable logic array.

17. The programmable logic array according to claim 14 wherein the control circuit is configured to detect a state change of an output signal of a slowest path of the programmable logic array and to deactivate the internal clock signal following the state change of the output signal of the slowest path.

18. A system comprising:
- means for receiving input signals and evaluating output signals according to the input signals during an evaluation phase;
- means for measuring a minimum duration to evaluate the output signals according to the input signals;
- means for generating an internal clock signal based on active edges of an external clock signal and the measured minimum duration; and
- means for maintaining the means for receiving in the evaluation phase based on the internal clock signal.

19. The system of claim 18 wherein the means for receiving comprises a programmable logic array and each evaluation phase is preceded by a precharge phase during which the input signals are applied to the programmable logic array and the means for generating is configured to adjust a duration of the precharge phase to at least a minimum duration to precharge the input signals in the programmable logic array.

20. The system of claim 18 wherein the means for receiving comprises a programmable logic array and the means for measuring comprises a signal path of the programmable logic array that is configured to be a slowest signal path of the programmable logic array, the means for measuring being configured to measure a propagation time of a signal in the slowest signal path of the programmable logic array.

21. The system of claim 20 wherein the means for measuring is configured to detect a change in a state change of an output signal of the slowest path of the programmable logic array and the means for generating is configured to deactivate the internal clock signal following the state change of the output signal of the slowest path.

22. A system comprising:
- a combinational logic configured to receive input signals and evaluate output signals according to the input signals during an evaluation phase; and
- a controller configured to measure a threshold duration to evaluate the output signals according to the input signals, to generate an internal clock based on active edges of an external clock signal with a duration based on the measured threshold duration, and to apply the internal clock signal to the combinational logic to maintain it in an active state as long as the internal clock signal is in an active state.

23. The system of claim 22 wherein the controller is configured to generate an alert signal when the internal clock signal is in an active state and an active edge of the external clock signal is received.

24. The system of claim 22 wherein each evaluation phase is preceded with a precharge phase during which the input signals are applied to the combinational logic, the controller being configured to adjust a duration of each precharge phase to at least a threshold duration to precharge the system.

25. The system of claim 22 wherein the combinational logic comprises a programmable logic array receiving the input signals and generating the output signals according to the input signals.

26. The system of claim 25 wherein the controller comprises a signal path of the programmable logic array configured to be a slowest signal path of the programmable logic array, and the controller is configured to measure the threshold minimum duration by measuring a propagation time of a signal in the slowest signal path.

27. The system of claim 26 wherein the controller is configured to detect a state change of an output signal of the slowest signal path of the programmable logic array, and to deactivate the internal clock signal following the detection of the state change of the output signal of the slowest signal path.

* * * * *

UNITED STATES PATENT AND TRADEMARK OFFICE
CERTIFICATE OF CORRECTION

PATENT NO. : 7,504,864 B2
APPLICATION NO. : 11/821094
DATED : March 17, 2009
INVENTOR(S) : Laurent Murillo et al.

Page 1 of 1

It is certified that error appears in the above-identified patent and that said Letters Patent is hereby corrected as shown below:

Column 13
Lines 60-61, "signals upon each transition according to input signals composing signals generated during a previous" should read as -- signals upon each transition according to input signals comprising signals generated during a previous --

Column 14
Line 24, "The state machine according to claim 7 wherein the" should read as -- The state machine according to claim 10 wherein the --

Signed and Sealed this

Seventh Day of July, 2009

JOHN DOLL
*Acting Director of the United States Patent and Trademark Office*